United States Patent [19]
Sun

[11] Patent Number: 5,406,111
[45] Date of Patent: Apr. 11, 1995

[54] PROTECTION DEVICE FOR AN INTERGRATED CIRCUIT AND METHOD OF FORMATION

[75] Inventor: Shih-Wei Sun, Austin, Tex.

[73] Assignee: Motorola Inc., Schaumburg, Ill.

[21] Appl. No.: 205,477

[22] Filed: Mar. 4, 1994

[51] Int. Cl.⁶ .................. H01L 29/90; H01L 21/265
[52] U.S. Cl. .................. 257/497; 257/498; 437/20; 437/28; 437/67; 437/228
[58] Field of Search .............. 257/497, 498; 437/15, 437/20, 28, 67, 228

[56] References Cited

U.S. PATENT DOCUMENTS 4,466,180  8/1984  Soclof .................. 257/498

OTHER PUBLICATIONS

Krakauer et al., "ESD Protection in a 3.3V Sub-Micron Silicided CMOS Technology," Electrical Overstress-/Electrostatic Discharge Symposium Proceedings, Sep. 16, 1992, pp. 250–257.

Charvaka Duvvury, "ESD Reliability for Advanced CMOS Technologies," 1990 International Electron Devices and Materials Symposium, Nov. 14, 1990, pp. 265–272.

*Primary Examiner*—Edward Wojciechowicz
*Attorney, Agent, or Firm*—Kent J. Cooper

[57] ABSTRACT

An input/output protection device for an integrated circuit is formed using a trench (22). A first electrode region (46) is formed adjacent a first portion of the trench sidewall (24), and a second electrode region (48) is formed adjacent a second portion of the trench sidewall (24). One of the electrode regions is then electrically coupled to an input/output pad, while the other electrode region is electrically coupled to ground. Excessive voltages on the input/output pad are then discharged when the electrode, which is electrically coupled to the input/output pad, punches through to the electrode that is electrically coupled to ground.

25 Claims, 4 Drawing Sheets

PROTECTION DEVICE FOR AN INTERGRATED CIRCUIT AND METHOD OF FORMATION

FIELD OF THE INVENTION

This invention relates generally to integrated circuits, and more specifically to a protection device for an integrated circuit and its method of formation.

BACKGROUND OF THE INVENTION

Integrated circuits typically have a protection device, which is placed in between an input or output (I/O) pad and its corresponding circuitry. The protection device prevents the circuitry from being damaged when a high voltage is placed on the I/O pad, such as during an electrostatic discharge (ESD). Protection devices are particularly important in MOS integrated circuits, because the breakdown voltage of a typical MOS transistor with a 15 nanometer gate oxide is approximately 15 volts. Therefore, electrostatic discharges, which may create voltages in excess of 1000 volts at an I/O pad, will damage MOS transistors if they are left unprotected. The protection device, however, shields the internal MOS circuitry from these excessive voltages, and thus protects the integrated circuit.

The semiconductor industry's continuing demand for integrated circuits with higher device densities and improved performance, however, requires that new processing techniques be used to fabricate them. For example, in order to achieve higher device densities new isolation schemes, such as trench isolation are required to fabricate advanced integrated circuits. In addition, high performance integrated circuits also require new metallization schemes, such as silicidation. Many of these new fabrication techniques, however, are either incompatible with existing protection devices or they degrade the performance of these devices. For example, it is known that the ESD performance of either a thin or a thick gate oxide ESD transistor is degraded when their source and drain regions are clad with a silicide layer. Therefore, an additional masking step is required to fabricate these devices, such that the source and drain regions of these devices are not entirely clad by a silicide layer. Accordingly a need exists for a protection device, which is compatible with high density integrated circuit fabrication techniques, such as trench isolation and silicide formation.

SUMMARY OF THE INVENTION

The previously mentioned problems with existing protection devices are overcome by the present invention. In one embodiment of the invention, a protection device for an integrated circuit has a doped region within a semiconductor substrate, and the doped region has a first conductivity type. It has a trench lying within the doped region, wherein the trench has a trench sidewall and a trench bottom. It has a first electrode region. The first electrode region has a first portion that substantially spans the vertical length of a first portion of the trench sidewall. The first electrode region has a second conductivity type. It also has a second electrode region. The second electrode region has a first portion that substantially spans a second portion of the trench sidewall, wherein the first and second electrode regions are on opposing portions of the trench sidewall. The second electrode region also has the second conductivity type. It also has a dielectric plug lying within the trench, wherein the dielectric plug substantially fills the trench.

Other aspects of the invention involve methods for making this protection device. These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
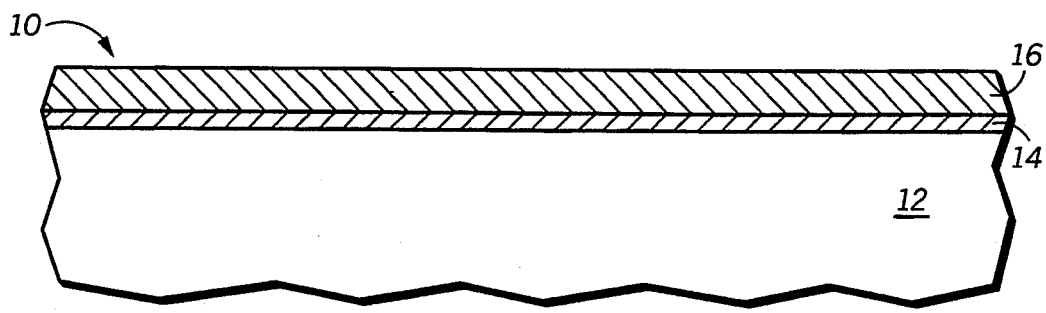
FIGS. 1-9 illustrate, in cross-section, process steps in accordance with one embodiment of the invention.

FIGS. 1 through 9 illustrate, in cross-section, process steps in accordance with one embodiment of the invention, wherein a protection device is formed in an integrated circuit. Shown in FIG. 1 is a portion 10 of an integrated circuit structure comprising a doped region 12 within a semiconductor substrate, the doped region having a first conductivity type, a buffer layer 14, and an oxidation resistant layer 16. Doped region 12 may be a portion of a doped semiconductor substrate or a well region formed within a semiconductor substrate. For example, doped region 12 may be a portion of either an n-type or p-type monocrystalline silicon substrate, or an n-type or p-type well region formed within either an n-type or p-type monocrystalline silicon substrate. Doped region 12 may also be a portion of a doped silicon on insulator substrate or a portion of a doped silicon on sapphire substrate, or the like. For example, doped region 12 may be a portion of either an n-type or p-type silicon on insulator substrate or a portion of either an n-type or p-type silicon on sapphire substrate, or an n-type or p-type well region formed within a silicon on insulator substrate or a silicon on sapphire substrate, or the like. Buffer layer 14 is preferably formed by thermally oxidizing the semiconductor substrate to form a thermal silicon dioxide layer, having a thickness ranging from 3 to 100 nanometers, which overlies doped region 12. Alternatively, buffer layer 14 may be chemical vapor deposited silicon dioxide or even a laminate comprising a layer of chemical vapor deposited silicon dioxide overlying a layer of thermal silicon dioxide. Following the formation of buffer layer 14, oxidation resistant layer 16 is formed over buffer layer 14. In accordance with a preferred embodiment, oxidation resistant layer 16 is preferably chemical vapor deposited silicon nitride, which may have a thickness ranging from 10 to 200 nanometers. Alternatively, oxidation resistant layer 16 may also be another material, such as boronitride or silicon oxynitride.

Figure 2:
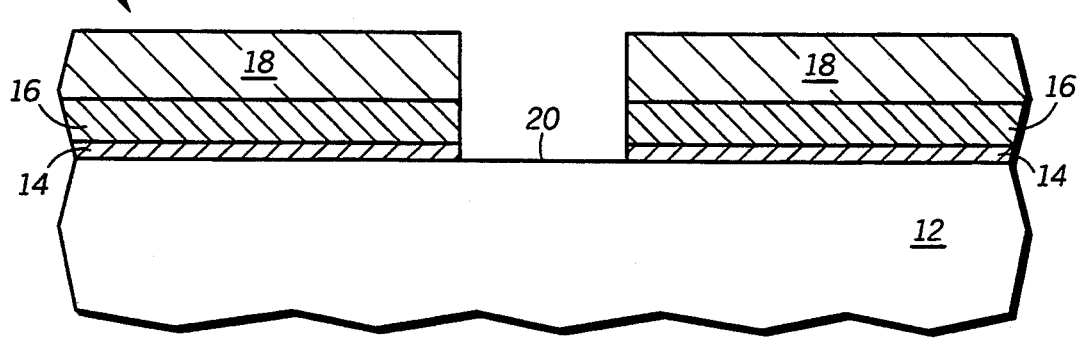

In FIG. 2, a photoresist mask 18, which overlies a portion of oxidation resistant layer 16, is used to pattern oxidation resistant layer 16 and underlying buffer layer 14 so that a surface portion 20 of doped region 12 is exposed. Photoresist mask 18 is formed using standard photolithographic patterning processes, and oxidation resistant layer 16 and buffer layer 14 are patterned using standard etching techniques.

Figure 3:
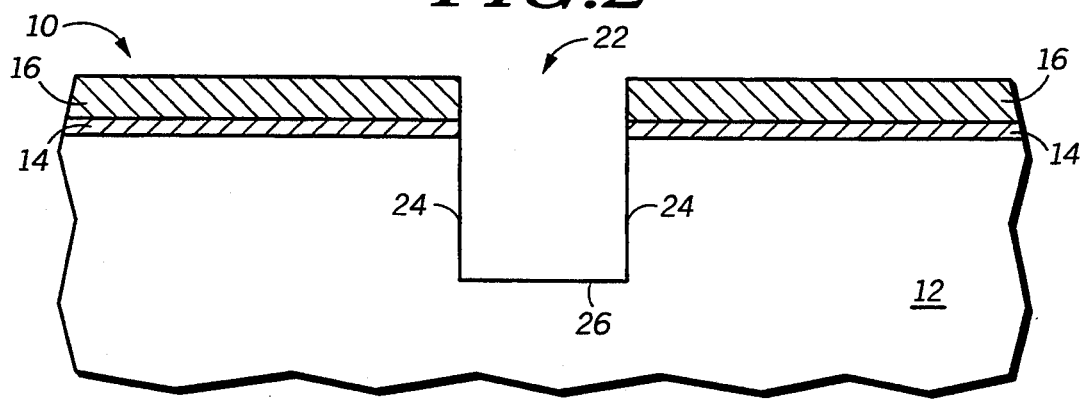

In FIG. 3, surface portion 20 is then anisotropically etched using standard etching techniques to form a trench 22 within doped region 12. Trench 22 has a trench sidewall 24 and a trench bottom 26. After trench 22 has been formed, photoresist mask 18 is then removed using standard photoresist stripping techniques. In addition, it should be appreciated that photoresist mask 18 may be removed after oxidation resistant layer 16 and buffer layer 14 have been patterned, and that oxidation resistant layer 16 may then be used as a hard mask when trench 22 is formed.

Figure 4:
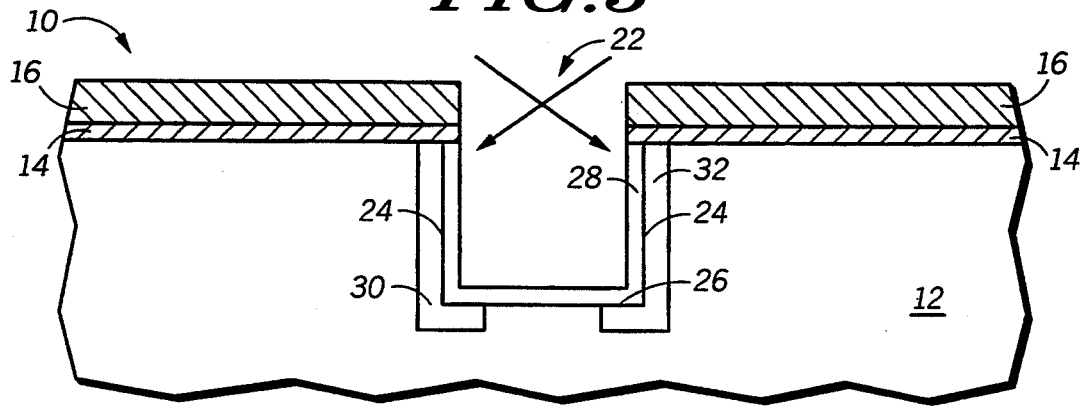

In FIG. 4, trench sidewall 24 and trench bottom 26 are oxidized to form a layer of thermal silicon dioxide 28 that abuts trench sidewall 24 and trench bottom 26. In a preferred embodiment thermal silicon dioxide layer 28 has a thickness ranging from 5 to 100 nanometers. Alternatively, a layer of chemical vapor deposited silicon dioxide may also be formed such that it abuts trench sidewall 24 and trench bottom 28. A portion of trench sidewall 24 is then doped using high angle tilt implantation to form a doped region 30 along a first portion of trench sidewall 24 and a doped region 32 along a second portion of trench sidewall 24. Oxidation resistant layer 16 acts as a mask during the implant, and thus prevents those portions of doped region 12 that underlie it from being implanted. Doped region 30 and doped region 32 substantially span the vertical width of trench sidewall 24, and they are formed on opposing portions of trench sidewall 24, as shown in FIG. 4. Doped region 30 and doped region 32 have a second conductivity type, which is different from that of doped region 12. Doped regions 30 and 32 may be formed to have an n-type conductivity by implanting phosphorous, antimony, or arsenic into doped region 12, or may be formed to have a p-type conductivity by implanting boron or indium into doped region 12. In addition, it should be appreciated that doped regions 30 and 32 may be formed either before or after thermal silicon dioxide layer 28 has been formed. It should also be appreciated that trench 22 may be formed at the same time as the isolation trenches for the integrated circuit, and that during the high angle implantation process the isolation trenches are covered with a photoresist mask in order to prevent them from being implanted.

Figure 5:
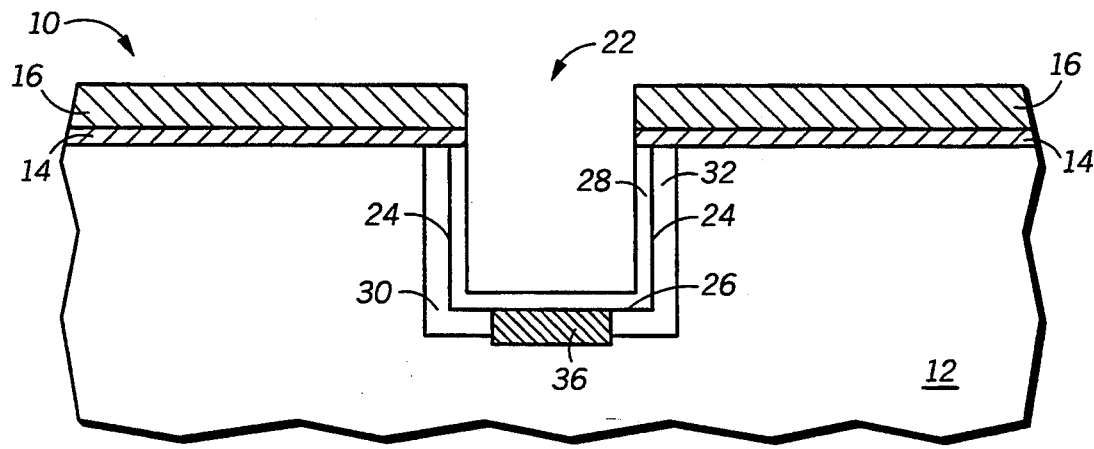

In FIG. 5, a portion of doped region 12 that underlies trench bottom 26 is then implanted with ions of the first conductivity type in order to form an implanted region 36. Implanted region 36 is used to adjust or set the trigger voltage of the protection device and may be formed either before or after doped region 30 and doped region 32 have been formed. In addition, it should also be appreciated that the formation of implanted region 36 is optional, because the trigger voltage of the protection device may also be set by doped region 12. More specifically, the doping concentration of doped region 12 may be selected such that it sets the trigger voltage for the protection device, and therefore implanted region 36 need not be formed. It is also important to note that the trigger voltage of the protection device is also dependent upon the separation distance between doped region 30 and doped region 32, and on the doping concentrations of doped regions 30 and 32. Therefore, the width of trench 22 may also be used to adjust the trigger voltage of the protection device, because the distance that separates doped region 30 from doped region 32 is dependent upon trench width, as shown in FIG. 4. Similarly the doping concentrations of doped regions 30 and 32 may also be used to adjust the trigger voltage of the protection device.

Figure 6:
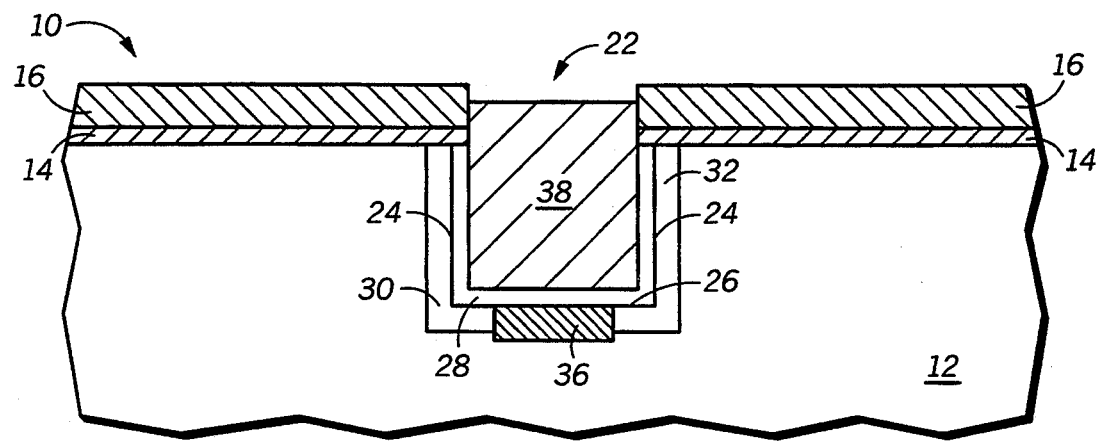

In FIG. 6, a trench fill material is then formed overlying oxidation resistant layer 16, such that trench 22 is substantially filled. In a preferred embodiment, the trench fill material is undoped chemically vapor deposited silicon dioxide, which is deposited using ozone and tetraethylorthosilicate (TEOS) as source gases. Alternatively, the trench fill material may also be doped silicon dioxide, such as germanium doped silicon dioxide or another dielectric material, such as silicon nitride. In addition, the trench fill material may also be formed using other techniques such as plasma enhanced chemical vapor deposition, electron cyclotron resonance deposition, or spin-on deposition. After its formation, the trench fill material is then selectively removed to expose oxidation resistant layer 16, and to form a dielectric plug 38 that lies within and substantially fills trench 22. In a preferred embodiment, chemical mechanical polishing is used to selectively remove a portion of the trench fill material and form dielectric plug 38. Alternatively, standard wet or plasma etching techniques may also be used to form trench plug 38, or a combination of chemical mechanical polishing and standard etching techniques may also be used to form trench plug 38. It should also be appreciated that oxidation resistant layer 16 may also be advantageously used as a polish stop or etchstop when dielectric plug 38 is formed.

Figure 7:
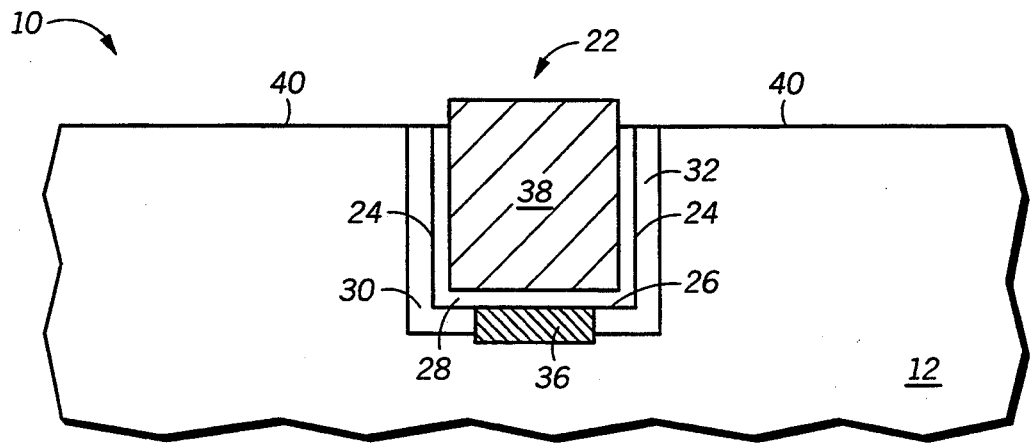

In FIG. 7, oxidation resistant layer 16 and buffer layer 14 are then removed to expose a surface portion 40 of doped region 12. In accordance with a preferred embodiment, wherein oxidation resistant layer 16 is silicon nitride and buffer layer 14 is silicon dioxide, oxidation resistant layer 16 may be removed in phosphoric acid and buffer layer 14 may be removed in buffered hydrofluoric acid. Alternatively, oxidation resistant layer 16 may also be removed using standard dry etching techniques.

Figure 8:
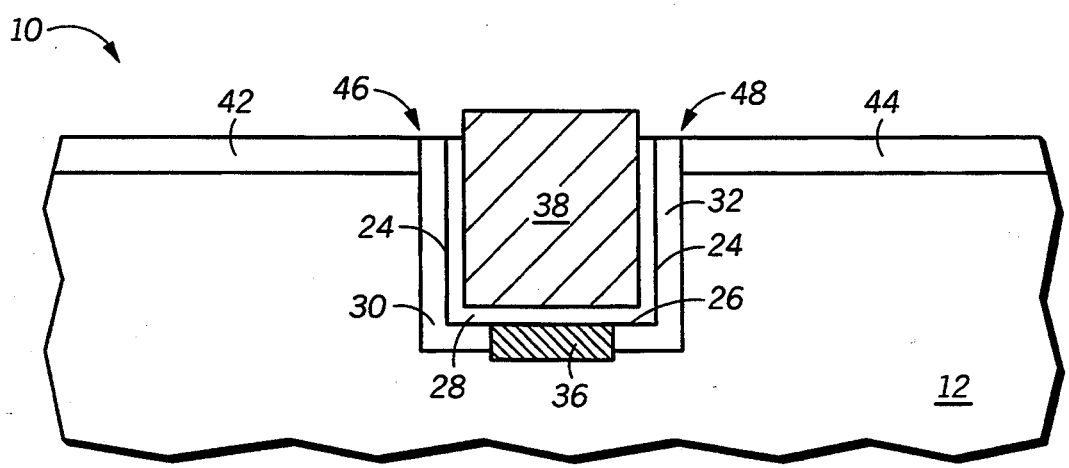

In FIG. 8, doped region 12 is then ion implanted with ions of a second conductivity type in order to form doped regions 42 and 44, and to form a first electrode region 46 and a second electrode region 48, wherein first electrode region 46 comprises doped region 42 and doped region 30 and second electrode region 46 comprises doped region 44 and doped region 32. Doped regions 42 and 44 may be formed to have an n-type conductivity by implanting phosphorous, antimony, or arsenic into doped region 12, or they may be formed to have a p-type conductivity by implanting boron or indium into doped region 12. First electrode region 46 has a first portion that is adjacent a first portion of trench sidewall 24, wherein the first portion of first electrode region 46 substantially spans the vertical length of trench sidewall 24. First electrode region 46 also has a second portion that lies within doped region 12 perpendicular to the first portion. Second electrode region 48 has a first portion that is adjacent a second portion of trench sidewall 24, wherein the first portion of second electrode region 48 substantially spans the vertical length of trench sidewall 24. In addition, second electrode region 48 also has a second portion that lies within doped region 12 perpendicular to the first portion. First electrode region 46 and second electrode region 48 have a second conductivity type that is different from that of doped region 12, and first electrode region 46 and second electrode region 48 lie on opposing portions of trench sidewall 24, as shown in FIG. 8. In an integrated circuit one electrode of the protection device will be electrically coupled to an I/O pad, while the other electrode may be electrically coupled to ground or the supply voltage. For example, first electrode region 46 may be electrically coupled to an I/O pad, while second electrode region 48 may be electrically coupled to ground, and under normal operating conditions first electrode region 46 would be electrically isolated from second electrode region 48. If an excessive voltage, however, is placed on the I/O pad then this voltage will cause first electrode region 46 to punchthrough to second electrode region 48 and the I/O pad will be discharged. It is important to note that the punchthrough or trigger voltage of the protection device is dependent upon trench width, the doping concentration of the semiconductive material that lies in between the two electrode regions, and the doping concentration of first and second electrode regions 46 and 48 along trench sidewall 24, as previously discussed.

Figure 9:
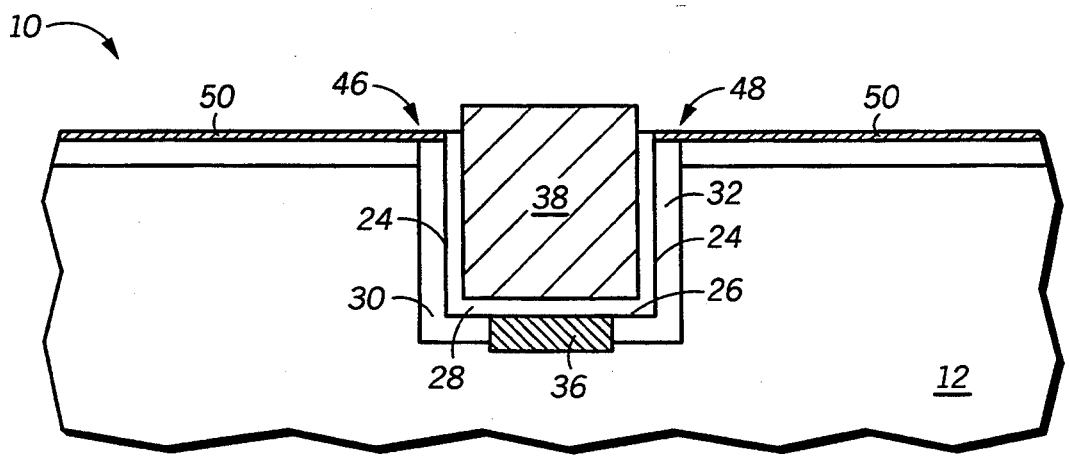

In FIG. 9, an optional silicide layer 50 is then formed overlying a portion of first electrode region 46 and a portion of second electrode region 48. In a preferred embodiment, silicide layer 50 is a titanium silicide layer, which may be formed using conventional deposition and annealing techniques. Alternatively, silicide layer 50 may also be a layer of cobalt silicide, platinum silicide, or the like. It is important to note that silicide layer 50 need not be formed using an extra masking step. This is because silicide layer 50 is automatically formed such that a portion of first electrode region 46 and a portion of second electrode region 48 is not silicided. More specifically, the respective portions of first electrode region 46 and second electrode region 48 that extend along trench sidewall 24 are not silicided, and thus the ESD performance of the protection device is not adversely effected by the silicidation process.

Figure 10:
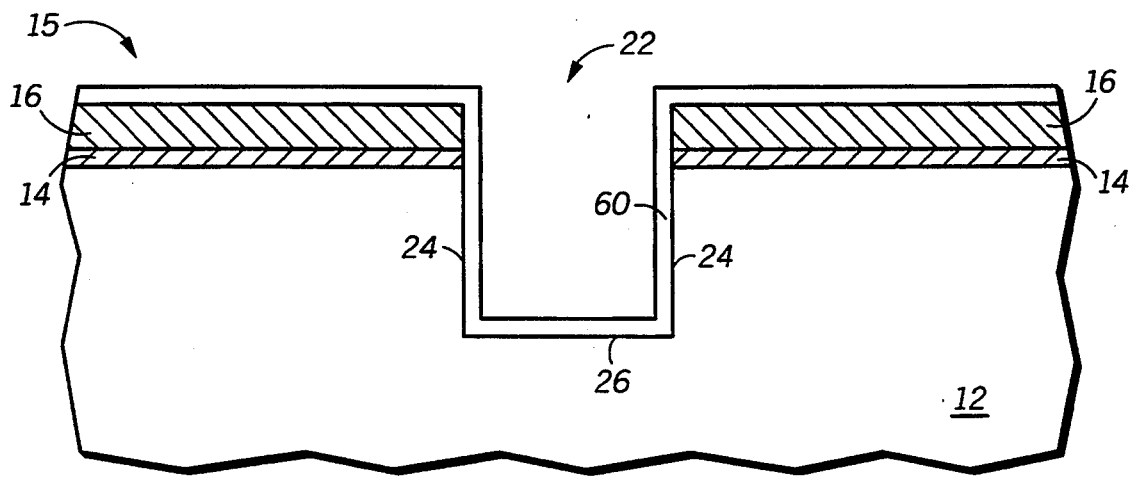
FIGS. 10-13 illustrate, in cross-section, process steps in accordance with a second embodiment of the invention, wherein like reference numerals designate identical or corresponding parts throughout the several views

FIGS. 10 through 13 illustrate, in cross-section, process steps in accordance with an alternative embodiment of the invention, wherein a protection device is formed in an integrated circuit. Shown in FIG. 10 is a portion 15 of an integrated circuit structure that is analogous to that shown in FIG. 3, wherein after trench 22 has been formed a doped layer 60 of material is formed within trench 22, such that it abuts trench sidewall 24. Doped layer 60 is preferably a dielectric layer. For example, doped layer 60 may be a dielectric layer doped with an n-type dopant, such as phosphorous doped glass, or arsenic doped glass, or it may be a dielectric layer doped with a p-type dopant, such as boron doped glass. Alternatively, doped layer 60 may also be a polysilicon layer, which is doped with an n-type dopant, such as phosphorus, or arsenic, or it may be doped with a p-type dopant, such as boron. Doped layer 60 may be formed using standard deposition or diffusion techniques, such as chemical vapor deposition, plasma deposition, and spin-on deposition.

Figure 11:
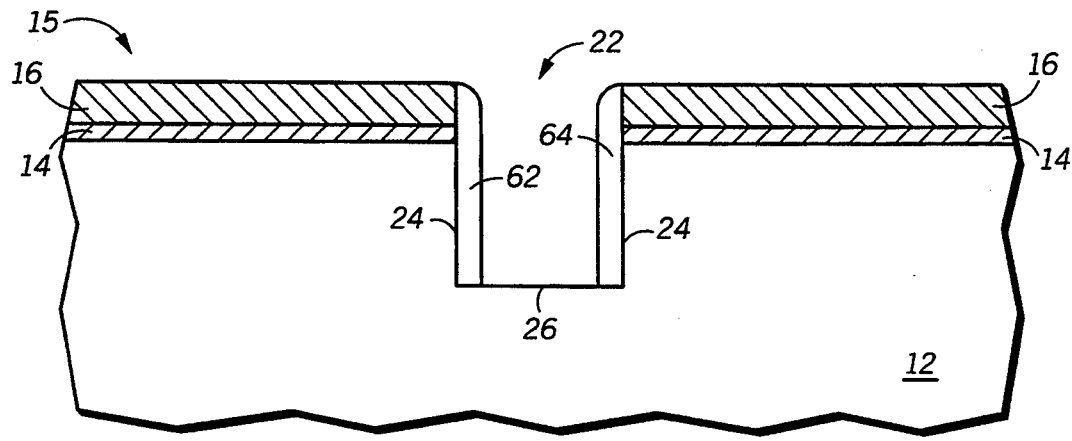

In FIG. 11, doped layer 60 is anisotropically etched to form a sidewall spacer 62 that abuts a first portion of trench sidewall 24, and to form a sidewall spacer 64 that abuts a second portion of trench sidewall 24. Sidewall spacer 62 and sidewall spacer 64 are formed on opposing portions of trench sidewall 24, as shown in FIG. 11.

Figure 12:
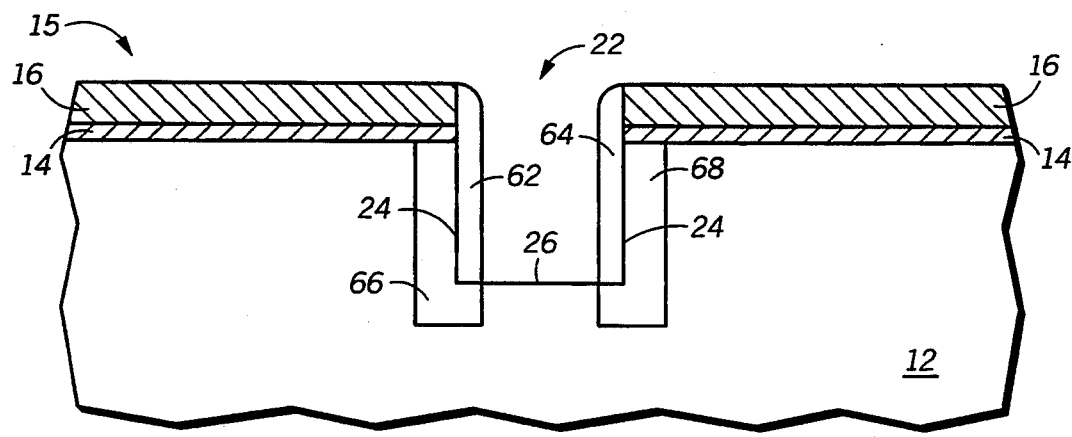

In FIG. 12, sidewall spacer 62 and sidewall spacer 64 are then used as dopant sources, and they are annealed in order to diffuse dopant into doped region 12 and form a doped region 66 adjacent the first portion of trench sidewall 24 and to form a doped region 68 adjacent the second portion of trench sidewall 24. Doped region 66 and doped region 68 substantially span the vertical width of trench sidewall 24, and they are formed on opposing portions of trench sidewall 24, as shown in FIG. 12. Doped region 66 and doped region 68 have a second conductivity type, which is different from that of doped region 12.

Figure 13:
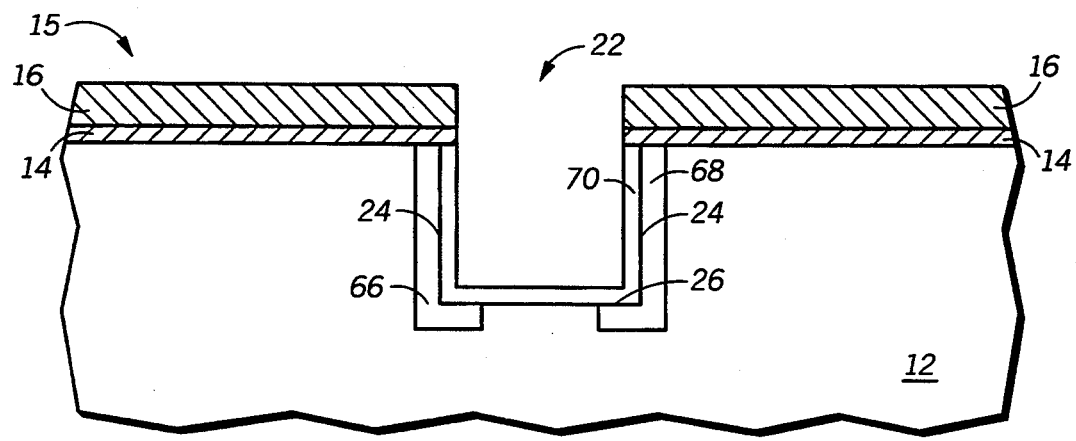

In FIG. 13, after sidewall spacer 62 and sidewall spacer 64 have been removed trench sidewall 24 and trench bottom 26 are then oxidized to form a layer of thermal silicon dioxide 70 that abuts trench sidewall 24 and trench bottom 26. Sidewall spacer 62 and sidewall spacer 64 may be removed using standard wet etch techniques. In addition, it should be appreciated that sidewall spacers 62 and 64 need not be removed after doped regions 66 and 68 are formed. For example, if polysilicon is used to form sidewall spacers 62 and 64 then the polysilicon sidewall spacers may be left within trench 22 after they have been annealed. In a preferred embodiment thermal silicon dioxide layer 70 has a thickness ranging from 5 to 100 nanometers. Alternatively, a layer of chemical vapor deposited silicon dioxide may also be formed such that it abuts trench sidewall 24 and trench bottom 28. Following the formation of thermal silicon dioxide 70 to result in the structure shown in FIG. 13, processing continues with the steps previously described in FIG. 5 through FIG. 9.

The foregoing description and illustrations contained herein demonstrate many of the advantages associated with the present invention. In particular, a protection device, which is compatible with trench isolation is disclosed. Moreover, the protection device is compatible with silicide formation because an extra mask is not required to prevent portions of the electrode regions from being silicided. Furthermore, the trigger voltage of the protection device may be adjusted by adjusting the width of trench 22, by adjusting the doping concentration of doped region 12 within which trench 22 is formed, by adjusting the doping concentration of first and second electrode regions 46 and 48 along trench sidewall 24, or by adjusting the doping concentration near the bottom of trench 22.

Thus it is apparent that there has been provided, in accordance with the invention, a protection device for an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, sidewall spacer 62 and sidewall spacer 64 need not be removed after doped regions 66 and 68 are formed. For example, dielectric plug 38 may be formed adjacent to sidewall spacers 62 and 64, and then sidewall spacers 62 and 64 could then be annealed to form doped regions 66 and 68. In addition, doped regions 30 and 32 need be formed such that they extend under trench bottom 26 as shown in FIG. 4. Moreover, the invention is not limited to the specific doped layers recited herein. It is envisioned that materials other than doped glass or doped polysilicon may be used. It is also important to note that the present invention is not limited in any way to high angle tilt implantation. It is envisioned that other implantation techniques may also be used. Furthermore, dielectric plug 38 may also be formed such that it is slightly recessed within trench 22. Therefore, it is intended that this invention encompass all such variations and modifications as fall within the scope of the appended claims.

I claim:

1. A method for forming a protection device for an integrated circuit comprising the steps of:
   providing a doped semiconductor substrate, the doped semiconductor substrate having a first conductivity type;
   forming a trench within the doped semiconductor substrate, the trench having a trench sidewall and a trench bottom;
   forming a first electrode region for the protection device adjacent a first portion of the trench sidewall and a second electrode region for the protection device adjacent a second portion of the trench sidewall, wherein the first and second electrode regions substantially span the vertical length of the trench sidewall, and are formed on opposing portions of the trench sidewall such that a punchthrough region is defined adjacent to the trench bottom, the first and second electrode regions having a second conductivity type and the punchthrough region having the first conductivity type; and
   forming a dielectric plug within the trench, the dielectric plug substantially filling the trench and overlying the punchthrough region.

2. The method of claim 1, further comprising the step of implanting a dopant of the first conductivity type into the punchthrough region.

3. The method of claim 1, wherein the step of forming the first and second electrode regions comprises the step of:
   ion implanting the doped semiconductor substrate with a dopant of the second conductivity type.

4. The method of claim 1, wherein the step of forming the first and second electrode regions comprises the step of:
   forming a doped layer of material within the trench.

5. The method of claim 4, wherein the step of forming the first and second electrode regions further comprises the step of:
   etching the doped layer of material to form a sidewall spacer.

6. The method of claim 5, wherein the step of etching the doped layer of material is further characterized as etching a doped layer which comprises polysilicon.

7. The method of claim 5, wherein the step of etching the doped layer of material is further characterized as etching a doped dielectric layer.

8. The method of claim 1, further comprising the step of forming a silicide layer overlying a portion of the first electrode region and a portion of the second electrode region.

9. The method of claim 1, wherein the step of providing the doped semiconductor substrate is further characterized as providing a p-type semiconductor substrate.

10. A method for forming a protection device for an integrated circuit comprising the steps of: providing a semiconductor substrate having a well region formed therein, the well region having a first conductivity type;
    forming a trench within the well region, the trench having a trench sidewall and a trench bottom;
    forming a first electrode region for the protection device adjacent a first portion of the trench sidewall and a second electrode region for the protection device adjacent a second portion of the trench sidewall, wherein the first and second electrode regions substantially span the vertical length of the trench sidewall, and are formed on opposing portions of the trench sidewall such that a punchthrough region is defined adjacent to the trench bottom, the first and second electrode regions having a second conductivity type and the punchthrough region having the first conductivity type; and
    forming a dielectric plug within the trench, the dielectric plug substantially filling the trench and overlying the punchthrough region.

11. The method of claim 10, further comprising the step of implanting a dopant of the first conductivity type into the punchthrough region.

12. The method of claim 10, wherein the step of forming the first and second electrode regions comprises the step of:
    ion implanting the well region with a dopant of the second conductivity type.

13. The method of claim 10, wherein the step of forming the first and second electrode regions comprises the step of:
    forming a doped layer of material within the trench.

14. The method of claim 13, wherein the step of forming the first and second electrode regions further comprises the step of:
    etching the doped layer of material to form a sidewall spacer.

15. The method of claim 14, wherein the step of etching the doped layer of material is further characterized as etching a doped layer which comprises polysilicon.

16. The method of claim 14, wherein the step of etching the doped layer of material is further characterized as etching a doped dielectric layer.

17. The method of claim 10, further comprising the step of forming a silicide layer overlying a portion of the first electrode region and a portion of the second electrode region.

18. The method of claim 10, wherein the step of providing a semiconductor substrate is further characterized as providing a semiconductor substrate with a p-type well region.

19. A protection device for an integrated circuit comprising:
    a doped region within a semiconductor substrate, the doped region having a first conductivity type;
    a trench lying within the doped region, the trench having a trench bottom and a trench sidewall;
    a first electrode region, the first electrode region having a first portion which substantially spans the vertical length of a first portion of the trench sidewall, the first electrode region having a second conductivity type;
    a second electrode region, the second electrode region having a first portion which substantially spans the vertical length of a second portion of the trench sidewall, wherein the first and second electrode regions are on opposing portions of the trench sidewall such that a punchthrough region is defined adjacent to the trench bottom, the second electrode region having the second conductivity type and the punchthrough region having the first conductivity type;
    a dielectric plug lying within the trench, the dielectric plug substantially filling the trench and overlying the punchthrough region.

20. The device of claim 19, wherein the doped region is further characterized as well region within the semiconductor substrate.

21. The device of claim 19, wherein the first electrode region is further characterized as having a second portion, wherein the second portion of the first electrode region lies within the doped region perpendicular to the first portion.

22. The device of claim 21, further comprising a silicide layer overlying the second portion of the first electrode region.

23. The device of claim 19, wherein the second electrode region is further characterized as having a second portion, wherein the second portion of the second electrode region lies within the doped region perpendicular to the first portion.

24. The device of claim 23, further comprising a silicide layer overlying the second portion of the second electrode region.

25. The device of claim 19, wherein the doped region is further characterized as having a p-type conductivity.

* * * * *